United States Patent
Tsuchida et al.

(12) 
(10) Patent No.: US 7,982,322 B2
(45) Date of Patent: Jul. 19, 2011

(54) LIQUID RESIN COMPOSITION FOR ELECTRONIC PART SEALING, AND ELECTRONIC PART APPARATUS UTILIZING THE SAME

(75) Inventors: Satoru Tsuchida, Chikusei (JP); Shinsuke Hagiwara, Chikusei (JP); Kazuyoshi Tendou, Tokyo (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 65 days.

(21) Appl. No.: 12/444,449

(22) PCT Filed: Sep. 28, 2007

(86) PCT No.: PCT/JP2007/069023
§ 371 (c)(1),
(2), (4) Date: Apr. 6, 2009

(87) PCT Pub. No.: WO2008/044496
PCT Pub. Date: Apr. 17, 2008

(65) Prior Publication Data
US 2010/0014263 A1    Jan. 21, 2010

(30) Foreign Application Priority Data
Oct. 6, 2006 (JP) ................ P2006-275082

(51) Int. Cl.
*H01L 23/29* (2006.01)
(52) U.S. Cl. ........ 257/789; 257/788; 257/793; 257/795; 257/780; 257/783; 174/259; 174/260; 428/320.2
(58) Field of Classification Search ......... 257/778–780, 257/787–789, 793, 795, 783; 174/259–260; 428/320.2
See application file for complete search history.

(56) References Cited

U.S. PATENT DOCUMENTS

| | | | | |
|---|---|---|---|---|
| 5,120,665 | A * | 6/1992 | Tsukagoshi et al. | 156/64 |
| 5,610,209 | A * | 3/1997 | Kiyono | 523/428 |
| 5,821,628 | A * | 10/1998 | Hotta | 257/783 |
| 5,965,947 | A * | 10/1999 | Nam et al. | 257/783 |
| 6,059,894 | A * | 5/2000 | Pendse | 148/23 |
| 6,632,881 | B1 * | 10/2003 | Tsuchida et al. | 525/65 |
| 7,397,139 | B2 * | 7/2008 | Ikezawa et al. | 257/787 |
| 7,521,011 | B2 * | 4/2009 | Ishikawara et al. | 264/211.21 |

FOREIGN PATENT DOCUMENTS

| | | |
|---|---|---|
| JP | 7-330869 | 12/1995 |
| JP | 10-168288 | 3/1998 |
| JP | 2004-075914 | 3/2004 |
| JP | 2004-303874 | 10/2004 |
| JP | 2005-350618 | 12/2005 |

OTHER PUBLICATIONS

English language Translation of International Preliminary Report on Patentability of International Appln. No. PCT/JP2007/069023 dated Apr. 30, 2009.

* cited by examiner

*Primary Examiner* — Cathy Lam
(74) *Attorney, Agent, or Firm* — Antonelli, Terry, Stout & Kraus, LLP.

(57) ABSTRACT

The present invention provides a liquid resin composition for electronic part sealing that is good in fluidity in a narrow gap, being free from void generation, and that excels in fillet formation; and an electronic part apparatus sealed thereby of high reliability (moisture resistance and thermal shock resistance). The liquid resin composition for electronic part sealing is characterized by comprising (A) an epoxy resin including a liquid epoxy resin, (B) a hardening agent including a liquid aromatic amine, (C) a hydrazide compound having an average particle diameter of less than 2 μm, and (D) an inorganic filler having an average particle diameter of less than 2 μm.

16 Claims, No Drawings

LIQUID RESIN COMPOSITION FOR ELECTRONIC PART SEALING, AND ELECTRONIC PART APPARATUS UTILIZING THE SAME

TECHNICAL FIELD

The present invention relates to a liquid resin composition for electronic part sealing, and an electronic part apparatus utilizing the same.

BACKGROUND ART

Hitherto, in the field of element-sealing for electronic part apparatuses such as transistors and ICs, sealing with resin has become a main current from the viewpoint of productivity, costs and others, and epoxy resin compositions have widely been used. The reason therefor is that epoxy resin is good in balance between various properties such as workability, formability, electric characteristics, moisture resistance, heat resistance, mechanical characteristics, and adhesiveness to inserted parts. In semiconductor devices undergoing bare chip packaging, such as a COB (Chip on Board), a COG (Chip on Glass), and a TCP (Tape Carrier Package), a liquid resin composition for electronic part sealing is widely used as a sealant. In a semiconductor device (of a flip-chip type) wherein semiconductor elements are connected directly to a wiring substrate wherein a ceramic, a glass/epoxy resin, a glass/imide resin, a polyimide film or the like is used as a base by means of bumps, a liquid resin composition for electronic part sealing is used as an underfill material with which a gap between the semiconductor elements and the wiring substrate that are bump-connected is filled. The liquid resin composition for electronic part sealing fulfils an important function in order to protect electronic parts from temperature, humidity, and mechanical external force.

As a hardening agent in a resin composition for electronic part sealing, an acid anhydride based hardening agent has been frequently used so far. The reason therefor is that a liquid material having a low viscosity is easily available and further the hardening performance can also be adjusted with relative ease by selecting a hardening accelerator. However, in the case of using the acid anhydride based hardening agent, there is generated a drawback that the moisture resistance of the hardened product is poor. Thus, from the viewpoint of an improvement in the moisture resistance, underfill materials wherein an amine based hardening agent is used as a hardening agent have been becoming a main current (see, for example, JP-A-2005-350618).

However, the progress of semiconductors is remarkable; according to the flip-chip type, wherein bump-connection is performed, the pitch of bumps becomes narrower and the height of the bumps becomes smaller as the number of the bumps becomes larger. As a result, the gap has been becoming narrower. Moreover, as the integration degree of semiconductor elements becomes higher, the chip size also becomes larger. For any underfill material, a property that the material flows onto a larger area in a narrow gap has been required. As the gap becomes narrower, the number of the bumps increases and the pitch of the bumps also becomes narrower. Thus, the flowing path of the underfill material becomes complicated, and voids are easily generated. Furthermore, an underfill material fills into the gap between a wiring substrate and semiconductor elements, and then a given amount of the material exudes into the vicinity of the semiconductor elements so that fillets are formed. If the shapes of the fillets are uneven, the fillets may be cracked at the time of temperature cycles or at some other time, or the underfill material may be peeled from the wiring board or the semiconductor elements. Such generation of voids or formation of uneven fillets produces a larger effect onto the reliability of semiconductor devices undergoing flip-chip packaging. In particular, about such voids, those skilled in the art have been understanding that it is effective for decreasing the generation of the voids that after an underfill material is filled, the material is quickly hardened.

As described above, about conventional acid anhydride based hardening agents, the adjustment of the hardening performance thereof is relatively easy; however, about amine based hardening agents, the adjustment of the hardening performance is generally difficult. Thus, when the hardening performance is made large, a problem that the adhesiveness lowers is caused.

An object of the invention is to provide a liquid resin composition for electronic part sealing which is good in fluidity in a narrow gap, is free from the generation of voids, and is excellent in fillet-forming performance; and a highly reliable electronic part apparatus provided with an electronic part sealed with this composition so as to give excellent moisture resistance and thermal shock resistance.

DISCLOSURE OF THE INVENTION

In order to solve the problems, the inventors have been eagerly investigating so as to find out that it is sufficient for the solution that a hardening agent containing a liquid aromatic amine and a hydrazide compound having an average particle diameter of less than 2 μm may be used. On the basis of this finding, the invention has been made.

The invention relates to (1) a liquid resin composition for electronic part sealing, containing (A) an epoxy resin including a liquid epoxy resin, (B) a hardening agent including a liquid aromatic amine, (C) a hydrazide compound having an average particle diameter of less than 2 μm, and (D) an inorganic filler having an average particle diameter of less than 2 μm.

The invention also relates to (2) the liquid resin composition for electronic part sealing according to item (1), wherein the hydrazide compound is at least one selected from aliphatic polybasic acid dihydrazide compounds having 2 to 10 carbon atoms, and aromatic polybasic acid dihydrazide compounds having 8 to 15 carbon atoms.

The invention also relates to (3) an electronic part apparatus provided with an electronic part sealed with a liquid resin composition for electronic part sealing as recited in item (1) or (2).

The invention also relates to (4) the electronic part apparatus according to item (3), wherein the electronic part is a semiconductor element, and the semiconductor element is connected directly onto a wiring substrate by means of a bump.

The invention also relates to (5) the electronic part apparatus according to item (4), wherein the bump is made of a lead-free metal.

The invention also relates to (6) the electronic part apparatus according to any one of items (3) to (5), wherein the length of a long side of the electronic part is 5 mm or more, and further the distance between a wiring substrate which constitutes the electronic part apparatus and a bump-connection surface of the electronic part is 60 μm or less.

The invention also relates to (7) the electronic part apparatus according to any one of items (3) to (6), wherein the length of a long side of the electronic part is 5 mm or more, and further the electronic part is a semiconductor element having a dielectric layer having a dielectric constant of 3.0 or less.

According to the invention, it is possible to provide a liquid resin composition for electronic part sealing which is good in fluidity in a narrow gap, is free from the generation of voids, and is excellent in fillet-forming performance; and a highly reliable electronic part apparatus provided with an electronic part sealed with this composition so as to give excellent moisture resistance and thermal shock resistance.

The liquid resin composition of the invention for electronic part sealing makes it possible to restrain the generation of voids when the composition is molded or shaped and lower the hardening temperature by making the gel time thereof short, as described in Examples. Even after the composition absorbs moisture, the adhesive force to various substrates is high; therefore, when this liquid resin composition for electronic part sealing is used to seal an electronic part, a highly reliable electronic part apparatus wherein the warpage of chips is small can be obtained. Thus, the invention has large industrial values.

BEST MODE FOR CARRYING OUT THE INVENTION

The liquid resin composition of the invention for electronic part sealing contains (A) an epoxy resin including a liquid epoxy resin, (B) a hardening agent including a liquid aromatic amine, (C) a hydrazide compound having an average particle diameter of less than 2 µm, and (D) an inorganic filler having an average particle diameter of less than 2 µm.

(A) Epoxy Resin

The epoxy resin (A) used in the invention is a resin including a liquid epoxy resin. The liquid epoxy resin is not particularly limited as far as the resin is in the form of liquid at normal temperature. The resin may be a liquid epoxy resin used ordinarily in liquid resin compositions for electronic part sealing. Specific examples of the liquid epoxy resin include diglycidyl ether type epoxy resins such as bisphenol A, bisphenol F, bisphenol AD, bisphenol S, and hydrogenated bisphenol A;

epoxidized novolac resins, each made from phenols and aldehydes, a typical example of which is o-cresol novolac type epoxy resin;

glycidyl ether type epoxy resins, which are each obtained by causing epichlorohydrin to react with a low-molecular-weight polyhydric phenol such as resorcinol or pyrogallol;

glycidyl ester type epoxy resins, which are each obtained by causing epichlorohydrin to react with a polybasic acid such as fumaric acid or dimer acid, glycidylamine type epoxy resins, which are each obtained by causing epichlorohydrin to react with an amine compound such as p-aminophenol, diaminodiphenylmethane, or isocyanuric acid;

linear aliphatic epoxy resins, which are each obtained by oxidizing olefin bonds with a peracid such as peracetic acid; and alicyclic epoxy resins. These liquid epoxy resins may be used alone or in combination of two or more thereof.

The epoxy equivalent of the liquid epoxy resin is preferably from 50 to 500.

Out of the above-mentioned liquid epoxy resins, bisphenol type epoxy resins are preferred from the viewpoint of fluidity, and glycidylamine type epoxy resins are preferred from the viewpoint of heat resistance, adhesiveness, and fluidity. These preferred liquid epoxy resins may be used alone or in combination of two or more thereof. The blend amount of the preferred liquid epoxy resins is preferably 20% or more by weight, more preferably 30% or more by weight, in particular preferably 50% or more by weight of the whole of the liquid epoxy resins in order to exhibit the performance.

As far as the advantageous effects of the invention are attained, the epoxy resin (A) may contain a solid epoxy resin. The blend amount of the solid epoxy resin is preferably 20% or less by weight of the whole of the epoxy resins from the viewpoint of the fluidity when the composition is molded or shaped.

In the invention, the amount of hydrolyzable chorine contained in the epoxy resin (A) is preferably smaller since the chorine is concerned with corrosion of aluminum wiring on an element such as an IC. In order to yield a liquid resin composition for electronic part sealing excellent in moisture resistance, the hydrolyzable chorine amount is preferably 500 ppm or less. The hydrolyzable chorine amount is an amount the index of which is a value obtained by dissolving 1 g of an epoxy resin into 30 mL of dioxane, adding 5 mL of a 1 N solution of KOH in methanol to the solution, causing the resultant to reflux for 30 minutes, and then subjecting the resultant to potentiometric titration.

(Hardening Agent)

The hardening agent (B) used in the invention is an agent including a liquid aromatic amine. The liquid aromatic amine is not particularly limited as far as the amine is an amine which has an aromatic ring and is in the form of liquid at normal temperature. Specific examples of the liquid aromatic amine include diethyltoluenediamine, 1-methyl-3,5-diethyl-2,4-diaminobenzene, 1-methyl-3,5-diethyl-2,6-diaminobenzene, 1,3,5-triethyl-2,6-diaminobenzene, 3,3'-diethyl-4,4'-diaminodiphenylmethane, 3,5,3',5'-tetramethyl-4,4'-diaminodiphenylmethane. Examples of commercially available products of these liquid aromatic amine compounds include EPICURE-W and EPICURE-Z (trade name, manufactured by Yuka Shell Epoxy K.K.), KAYAHARD A-A, KAYAHARD A-B and KAYAHARD A-S (trade name, manufactured by Nippon Kayaku Co., Ltd.), TOHTOAMINE HM-205 (trade name, manufactured by Tohto Kasei Co., Ltd.), ADEKA HARDNER EH-101 (trade name, manufactured by Asahi Denka Kogyo K.K.), and EPOMIC Q-640 and EPOMIC Q-643 (trade name, manufactured by Mitsui Chemicals, Inc.), DETDA80 (trade name, manufactured by Lonza).

The liquid aromatic amines may be used alone or in combination of two or more thereof.

Out of the above-mentioned liquid aromatic amines, preferred are 3,3'-diethyl-4,4'-diaminodiphenylmethane, and diethyltoluenediamine from the viewpoint of storage stability. Examples of diethyltoluenediamine include 3,5-diethyl-toluene-2,4-diamine and 3,5-diethyltoluene-2,6-diamine. These may be used alone, or as a mixture of the two. It is preferred to use a mixture containing 60% or more by weight of 3,5-diethyltoluene-2,4-diamine.

As far as the advantageous effects of the invention are attained, the hardening agent (B) may include a substance that is conventionally used as a hardening agent for epoxy resin, such as a phenolic hardening agent or an acid anhydride based hardening agent. A solid hardening agent may be used together.

The content of the liquid aromatic amine is preferably 60% or more by weight, more preferably 80% or more by weight of the whole of the hardening agent (B) in order to exhibit the performance of the amine.

The ratio by equivalent of the epoxy resin (A) to the hardening agent (B), that is, the ratio of the number of reactive groups in the hardening agent (B) to the number of epoxy groups in the epoxy resin (A) (the number of active hydrogen atoms in the hardening agent+the number of hydroxyl groups therein+the number of acid anhydride groups therein/the number of epoxy groups in the epoxy resin) is not particularly limited, and is preferably from 0.7 to 1.6, more preferably from 0.8 to 1.4, in particular preferably from 0.9 to 1.2 in order to control the unreacted amounts of the individual components to small amounts.

(C) Hydrazide Compound

In the invention, it is essential to use a hydrazide compound having an average particle diameter of less than 2 μm. The use causes the promotion of reaction between the epoxy resin (A), which includes a liquid epoxy resin, and the hardening agent (B), which includes a liquid aromatic amine, so as to yield a liquid resin composition for electronic part sealing good in adhesiveness to a solder resist on a substrate surface, a polyimide film on a copper wiring or semiconductor chip surface, a passivation film made of silicon nitride, silicon oxide or the like, or some other film.

The hydrazide compound (C) used in the invention is a compound obtained by substituting one or more hydroxyl groups of a monobasic acid or polybasic acid with one or more hydrazino groups. Specific examples of the hydrazide compound include aliphatic monobasic acid hydrazide compounds such as acetic acid hydrazide, propionic acid hydrazide, butyric acid hydrazide, pentanoic acid hydrazide, caproic acid hydrazide, enanthic acid hydrazide, and caprylic acid hydrazide; aliphatic bibasic acid dihydrazide compounds, such as succinic acid dihydrazide, maleic acid dihydrazide, adipic acid dihydrazide, glutaric acid dihydrazide, sebacic acid dihydrazide, dodecandioic acid dihydrazide, and cylohexanedicarboxylic acid dihydrazide; aromatic monobasic acid hydrazide compounds such as benzoic acid hydrazide; and aromatic polybasic dihydrazide compounds, such as phthalic acid dihydrazide, isophthalic acid dihydrazide and terephthalic acid dihydrazide.

These hydrazide compounds may be used alone or in combination of two or more thereof.

Out of the above-mentioned hydrazide compounds, preferred are aliphatic polybasic acid dihydrazide compounds having 2 to 10 carbon atoms and aromatic polybasic acid dihydrazide compounds having 8 to 15 carbon atoms from the viewpoint of hardening promoting effect.

In the invention, it is important that the average particle diameter of the hydrazide compound (C) is less than 2 μm. When the average particle diameter is set to less than 2 μm, even a small blend amount thereof makes it possible to exhibit a sufficient hardening promoting effect so that the hardenability of the liquid resin composition for electronic part sealing becomes good. Thus, a highly reliable electronic part apparatus can be obtained. The average particle diameter is preferably from 0.1 to 2 μm, more preferably from 0.5 to 1.8 μm.

The maximum particle diameter of the hydrazide compound (C) is preferably 20 μm or less, more preferably from 5 to 15 μm from the viewpoint of reactivity.

When the liquid resin composition of the invention for electronic part sealing is used as an underfill material, the distance (gap) between a wiring substrate and the bump-connection surface of an electronic part is narrow; thus, the average particle diameter of the hydrazide compound (C) is preferably 1/20 or less of the gap, and the maximum particle diameter of the hydrazide compound (C) is preferably 1/2 or less of the gap.

In the invention, any particle diameter and any maximum particle diameter may be obtained by, for example, particle diameter distribution measurement based on laser diffraction analysis. Any average particle diameter may be obtained as a weight-average value.

The blend amount of the hydrazide compound (C) is not particularly limited as far as the amount is an amount permitting hardening promoting effect to be attained. When the total of the active hydrogen equivalent of the hardening agent (B) and the active hydrogen equivalent of the hydrazide compound (C) is set to 1 equivalent per equivalent of the epoxy resin (A), the active hydrogen equivalent of the hydrazide compound (C) ranges preferably from 0.02 to 0.3 equivalent, more preferably from 0.05 to 0.20 equivalent.

(Hardening Promoting Agent)

The liquid resin composition of the invention for electronic part sealing may contain a hardening promoting agent other than the hydrazide compound (C). The hardening promoting agent is not particularly limited as far as the agent is an agent for promoting the reaction between the epoxy resin (A), which includes a liquid epoxy resin, and the hardening agent (B), which includes a liquid aromatic amine. The hardening promoting agent may be a hardening promoting agent known in the prior art. Specific examples of the hardening promoting agent include cycloamidine compounds, such as 1,8-diaza-bicyclo(5,4,0)undecene-7,1,5-diaza-bicyclo(4,3,0)nonene, and 5,6-dibutylamino-1,8-diaza-bicyclo(5,4,0)undecene-7; tertiary amine compounds, such as triethylenediamine, benzyldimethylamine, triethanolamine, dimethylaminoethanol, and tris(dimethylaminomethyl)phenol; imidazole compounds, such as 2-methylimidazole, 2-ethyl-4-methylimidazole, 2-phenylimidazole, 2-phenyl-4-methylimidazole, 1-benzyl-2-phenylimidazole, 1-benzyl-2-methylimidazole, 2-phenyl-4,5-dihydroxymethylimidazole, 2-phenyl-4-methyl-5-hydroxymethylimidazole, 2,4-diamino-6-(2'-methylimidazolyl-(1'))-ethyl-s-triazine, and 2-heptadecylimidazole; trialkylphosphines, such as tributylphosphine; dialkylarylphosphines, such as dimethylphenylphosphine; alkyldiarylphosphines, such as methyldiphenylphosphine; organic phosphines, such as triphenylphosphine, and alkyl-substituted triphenylphosphine; compounds having intramolecular polarization, which are each obtained by adding, to any one of the above-mentioned compounds, a compound having a π bond, such as maleic anhydride, a quinone compound such as 1,4-benzoquinone, 2,5-toluquinone, 1,4-naphthoquinone, 2,3-dimethylbenzoquinone, 2,6-dimethylbenzoquinone 2,3-dimethoxy-5-methyl-1,4-benzoquinone, 2,3-dimethoxy-1,4-benzoquinone or phenyl-1,4-benzoquinone, diazophenylmethane, or phenol resin; derivatives of these compounds; and phenylborates, such as 2-ethyl-4-methylimidazol tetraphenylborate, and N-methylmorpholine tetraphenylborate.

These hardening promoting agents may be used alone or in combination of two or more thereof.

As a latent hardening promoting agent, for example, the following may be used: core-shell particles each having a core layer made of a compound which has an amino group and is in a solid form at normal temperature, and having a shell layer made of an epoxy compound which is in a solid form at normal temperature (trade name: "AMICURE", manufactured by Ajinomoto Co., Inc.), or an agent wherein a micro-encapsulated amine is dispersed in a bisphenol A type epoxy resin and a bisphenol F type epoxy resin (trade name: "NOVACURE", manufactured by Asahi Kasei Chemicals Corp.).

Out of the above-mentioned hardening promoting agents, preferred are imidazole compounds, or an agent wherein a micro-encapsulated amine is dispersed in a bisphenol A type epoxy resin and a bisphenol F type epoxy resin from the viewpoint of the balance between hardening promoting effect and reliability. More preferred examples of the imidazole compounds include imidazole compounds having a phenyl group and a hydroxyl group as substituent, such as 2-phenyl-4,5-dihydroxymethylimidazole, and 2-phenyl-4-methyl-5-hydroxymethylimidazole.

(D) Inorganic Filler

The inorganic filler (D) used in the invention is not particularly limited as far as the filler is a filler used ordinarily in liquid resin compositions for electronic part sealing. A specific example of the inorganic filler (D) is powder made of a silica such as fused silica or crystalline silica, calcium carbonate, clay, an alumina such as alumina oxide, silicon nitride, silicon carbide, boron nitride, calcium silicate, potassium titanate, aluminum nitride, beryllia, zirconia, zircon, forsterite, steatite, spinel, mullite, titania, or the like; beads obtained by making this powder spherical; or glass fiber. Examples of an inorganic filler having flame-retardant effect include aluminum hydroxide, magnesium hydroxide, zinc borate, and zinc molybdate.

These inorganic fillers may be used alone or in combination of two or more thereof.

Out of the inorganic fillers, fused silica is preferred. Spherical silica is more preferred from the viewpoint of the fluidity/penetrating performance of the liquid resin composition for electronic part sealing in a narrow gap.

In the invention, it is important that the average particle diameter of the inorganic filler (D) is less than 2 μm. If the average particle diameter is 2 μm or more, the dispersibility of the inorganic filler is poor and further the fluidity/penetrating performance of the liquid resin composition for electronic part sealing in a narrow gap falls so that voids are generated or the filler is not filled. The average particle diameter is preferably 0.1 μm or more and less than 2 μm, more preferably 0.5 μm or more and 1.5 μm or less. In the case of spherical silica, the average particle diameter is preferably 0.3 μm or more. If the average particle diameter is less than 0.3 μm, the dispersibility thereof in the liquid resin composition for electronic part sealing tends to be poor and further thixotropy is given to the liquid resin composition for electronic part sealing so that the fluidity thereof tends to be poor.

The blend amount of the inorganic filler (D) is from 20 to 90% by weight of the total of the liquid resin composition for electronic part sealing, more preferably from 25 to 80% by weight thereof, in particular preferably from 30 to 60% by weight thereof. If the blend amount is less than 20% by weight, the effect of decreasing the thermal expansion coefficient tends to become low. If the amount is more than 90% by weight, the viscosity of the liquid resin composition for electronic part sealing rises so that the fluidity/penetrating performance and the workability tend to deteriorate.

(Flexible Agent)

Various flexible agents may be incorporated into the liquid resin composition of the invention for electronic part sealing in order to improve the thermal impact resistance, decrease a stress onto semiconductor elements, and attain others. The flexible agents are not particularly limited; rubber particles are preferred. Specific examples thereof include rubber particles made of one or more rubbers such as styrene-butadiene rubber (SBR), nitrile-butadiene rubber (NBR), butadiene rubber (BR), urethane rubber (UR), and acrylic rubber (AR). From the viewpoint of heat resistance and moisture resistance, out of these rubber particles, rubber particles made of acrylic polymer are preferred, and core-shell type acrylic polymer, that is, core-shell type acrylic rubber particles are more preferred.

Rubber particles other than the above may be silicone rubber particles. Specific examples thereof include silicone rubber particles obtained by crosslinking a linear polyorganosiloxane, such as polydimethylsiloxane, polymethylphenylsiloxane or polydiphenylsiloxane; silicon rubber particles the surfaces of which are covered with a silicone resin; and core-shell polymer particles each having a core layer made of a solid silicone particle yielded by emulsion polymerization or the like, and a shell layer made of an organic polymer such as acrylic resin. The shape of the silicone rubber particles may be amorphous or spherical. The shape is preferably spherical from the viewpoint of the moldability or shapability of the liquid resin composition for electronic part sealing. These silicone rubber particles are available as commercially available products from The Dow Corning Toray Silicone Co., Ltd., Shin-Etsu Chemical Co., Ltd., and others.

The average primary particle diameter of the rubber particles is preferably 0.05 μm or more and less than 5.0 μm, more preferably 0.1 μm or more and 2.0 μm or less. If the average primary particle diameter is less than 0.05 μm, the dispersibility into the liquid resin composition for electronic part sealing tends to be poor. If the diameter is 5.0 μm or more, the stress-decreasing effect tends to be low. Additionally, the fluidity/penetrating performance of the liquid resin composition for electronic part sealing in a narrow gap lowers so that the following is easily caused: voids are generated, or the composition is not filled.

The blend amount of the rubber particles is preferably from 1 to 30% by weight of the whole of the liquid resin composition for electronic part sealing from which the inorganic filler (D) is excluded, more preferably form 2 to 20% by weight thereof. If the blend amount of the rubber particles is less than 1% by weight, the stress-decreasing effect tends to be low. If the amount is more than 30% by weight, the viscosity of the liquid resin composition for electronic part sealing rises so that the moldability or shapability (fluidity) tends to be poor.

(Surfactant)

Various surfactants may be incorporated into the liquid resin composition of the invention for electronic part sealing in order to decrease the generation of voids when the composition is molded or shaped, and improve the adhesive force to various adherends on the basis of an improvement on the wettability thereto. The surfactants are not particularly limited, and are preferably nonionic surfactants. Specific examples thereof include polyoxyethylene alkyl ether based, polyoxyalkylene alkyl ether based, sorbitan aliphatic acid ester based, polyoxyethylene sorbitan aliphatic acid ester based, polyoxyethylene sorbitol aliphatic acid ester based, glycerin aliphatic acid ester based, polyoxyethylene aliphatic acid ester based, polyoxyethylenealkylamine based, alkylalkanolamide based, polyether-modified silicone based, alkyl-modified silicone based, polyester-modified silicone based, and polyacrylic resin based surfactants. The surfactants may be used alone or in combination of two or more thereof. These surfactants are available as commercially available products from BYK Japan K.K., Kao Corp., and others.

A silicone-modified epoxy resin may be added as one of the surfactants. The silicone-modified epoxy resin may be obtained as a reactant made from an organosiloxane having a functional group reactive with an epoxy group, and an epoxy resin. The silicone-modified epoxy resin is preferably in a liquid form at normal temperature. Examples of the organosiloxane having a functional group reactive with an epoxy group include dimethylsiloxane, diphenylsiloxane or methylphenylsiloxane having in a single molecule thereof one or more amino groups, carboxyl groups, hydroxyl groups, phenolic hydroxyl groups, mercapto groups or the like. The weight-average molecular weight of the organosiloxane having a functional group reactive with an epoxy group is preferably from 500 to 5000. If the weight-average molecular weight is less than 500, the compatibility with the resin system becomes too good. Thus, the effect as an additive is not easily exhibited. If the weight-average molecular weight is more than 5000, the surfactant becomes incompatible with the resin system so that the silicone-modified epoxy resin separates and exudes when the composition is molded or shaped. As a result, the adhesiveness or the external appearance is easily damaged.

The epoxy resin for yielding the silicone-modified epoxy resin is not particularly limited as far as the resin is an epoxy resin compatible with the resin system of the liquid resin composition for electronic part sealing. The epoxy resin may be an epoxy resin used ordinarily in liquid resin compositions for electronic part sealing. Specific examples of the epoxy resin include glycidyl ether type epoxy resins, which are each obtained by causing epichlorohydrin to react with bisphenol A, bisphenol F, bisphenol AD, bisphenol S, naphthalenediol, hydrogenated bisphenol A, or the like; novolac type epoxy resins, which are each obtained by epoxidizing a novolac resin, which is obtained by condensing or co-condensing phenols with an aldehydes, a typical example of the novolac type epoxy resins being o-cresol novolac type epoxy resin; glycidyl ester type epoxy resins, which are each obtained by causing epichlorohydrin to react with a polybasic acid such as phthalic acid, or dimer acid; glycidylamine type epoxy resins, which are each obtained by causing epichlorohydrin to react with a polyamine such as diaminodiphenylmethane or isocyanuric acid; linear aliphatic epoxy resins, which are each obtained by oxidizing olefin bonds with a peracid such as peracetic acid; and alicyclic epoxy resins. Out of these resins, epoxy resins which are in a liquid form at normal temperature are preferred. These epoxy resins may be used alone or in combination of two or more thereof.

The blend amount of the surfactant is preferably from 0.01 to 1.5% by weight of the whole of the liquid resin composition for electronic part sealing, more preferably from 0.05 to 1% by weight thereof. If the blend amount of the surfactant is less than 0.01% by weight, a sufficient addition effect is not obtained. If the amount is more than 1.5% by weight, the surfactant exudes from the surface of the hardened composition when the composition is hardened so that the adhesive force tends to lower.

(Coupling Agent)

A coupling agent may be optionally incorporated into the liquid resin composition of the invention for electronic part sealing in order to strengthen interface adhesion between the resin and the inorganic filler or between the resin and constituting members of an electronic part apparatus. The coupling agent is not particularly limited, and may be a coupling agent known in the prior art. Examples of the coupling agent include silane compounds having one or more primary and/or secondary and/or tertiary amino groups, epoxysilanes, mercaptosilanes, alkylsilanes, ureidosilanes, vinylsilanes and various other silane compounds, titanium based compounds, aluminum chelates, and aluminum/zirconium based compounds. Specific examples thereof include silane coupling agents such as vinyltrichlorosilane, vinyltriethoxysilane, vinyltris(β-methoxyethoxy)silane, γ-methacryloxypropyltrimethoxysilane, β-(3,4-epoxycyclohexyl)ethyltrimethoxysilane, γ-glycidoxypropyltrimethoxysilane, γ-glycidoxypropylmethyldimethoxysilane, vinyltriacetoxysilane, γ-mercaptopropyltrimethoxysilane, γ-aminopropyltrimethoxysilane, γ-aminopropylmethyldimethoxysilane, γ-aminopropyltriethoxysilane, γ-aminopropylmethyldiethoxysilane, γ-anilinopropyltrimethoxysilane, γ-anilinopropyltriethoxysilane, γ-(N,N-dimethyl)aminopropyltrimethoxysilane, γ-(N,N-diethyl)aminopropyltrimethoxysilane, γ-(N, N-dibutyl)aminopropyltrimethoxysilane, γ-(N-methyl)anilinopropyltrimethoxysilane, γ-(N-ethyl)anilinopropyltrimethoxysilane, γ-(N,N-dimethyl)aminopropyltriethoxysilane, γ-(N,N-dibutyl)aminopropyltriethoxysilane, γ-(N-methyl)aminopropyltriethoxysilane, γ-(N-ethyl)anilinopropyltriethoxysilane, γ-(N,N-dimethyl)anilinopropyltriethoxysilane, γ-(N,N-diethyl)aminopropylmethyldimethoxysilane, γ-(N,N-dibutyl)aminopropylmethyldimethoxysilane, γ-(N-methyl)aminopropylmethyldimethoxysilane, γ-(N-ethyl)anilinopropylmethyldimethoxysilane, anilinopropylmethyldimethoxysilane, N-(trimethoxysilylpropyl)ethylenediamine, N-(dimethoxymethylsilylisopropyl)ethylenediamine, methyltrimethoxysilane, dimethyldimethoxysilane, methyltriethoxysilane, γ-chloropropyltrimethoxysilane, hexamethyldisilane, vinyltrimethoxysilane, and γ-mercaptopropylmethyldimethoxysilane; and titanate coupling agents such as isopropyltriisostearoyl titanate, isopropyltris(dioctylpyrophosphate)titanate, isopropyltri(N-aminoethyl-aminoethyl)titanate, tetraoctylbis(ditridecylphosphate)titanate, tetra(2,2-diallyloxymethyl-1-butyl)bis(ditridecyl)phosphate titanate, bis(dioctylpyrophosphate)oxyacetate titanate, bis(dioctylpyrophosphate)ethylene titanate, isopropyltrioctanoyl titanate, isopropyldimethacrylisostearoyl titanate, isopropyltridodecylbenzenenesulfonyl titanate, isoproylisostearoyldiacryl titanate, isopropyltri(dioctylphosphate)titanate, isopropyltricumylphenyl titanate, and tetraisopropylbis(dioctylphosphite)titanate. These coupling agents may be used alone or in combination of two or more thereof.

(Ion Trapping Agent)

An ion trapping agent represented by a composition formula (I) or (II) illustrated below may be incorporated into the liquid resin composition of the invention for electronic part sealing in order to improve the migration resistance of semiconductor elements such as ICs, the moisture resistance thereof, and the high-temperature-standing property thereof.

$$Mg_{1-X}Al_X(OH)_2(CO_3)_{X/2} \cdot mH_2O \qquad (I)$$

wherein $0 \leq X \leq 0.5$, and m is a positive number, and

$$BiO_x(OH)_y(NO_3)_z \qquad (II)$$

wherein $0.9 \leq x \leq 1.1$, $0.6 \leq y \leq 0.8$, and $0.2 \leq z \leq 0.4$.

About the ion trapping agent represented by the formula (I), an agent (trade name: "DHT-4A") manufactured by Kyowa Chemical Industry Co., Ltd. is available as a commercially available product. About the ion trapping agent represented by the formula (II), an agent (trade name: "IXE 500") manufactured by Toagosei Co., Ltd. is available as a commercially available product.

The blend amount of the ion trapping agent is preferably from 0.1 to 3.0% by weight of the whole of the liquid resin composition for electronic part sealing, more preferably from 0.3 to 1.5% by weight thereof.

The average particle diameter of the ion trapping agent is from 0.1 to 3.0 μm, and the maximum particle diameter is preferably 10 μm or less.

A different anion exchanger may be optionally incorporated. The anion exchanger is not particularly limited, and may be an anion exchanger known in the prior art. Specific examples of the anion exchanger include hydrated oxides of an element selected from magnesium, aluminum, titanium, zirconium, antimony, and others. These anion exchangers may be used alone or in combination of two or more thereof.

Other additives may be optionally incorporated into the liquid resin composition of the invention for electronic part sealing, examples of the additives including colorants such as dye and carbon black, a diluting agent, a leveling agent, and an antifoaming agent.

The liquid resin composition of the invention for electronic part sealing may be prepared by any method as far as the above-mentioned individual components can be uniformly dispersed and mixed. According to an ordinary method, the composition can be obtained by weighing predetermined blend amounts of the individual components, mixing and kneading the components by use of a crusher, a mixing roll, a planetary mixer or the like, and optionally defoaming the mixture.

The viscosity of the liquid resin composition of the invention for electronic part sealing is preferably from 5 to 200 Pa·s, more preferably from 10 to 100 Pa·s at 25° C. The viscosity of the liquid resin composition for electronic part sealing at 25° C. can be obtained by measuring the composition with an E-type viscometer (cone angle: 3°, and rotation number: 10 rpm).

The gel time of the liquid resin composition of the invention for electronic part sealing is preferably 500 seconds or less, more preferably 300 seconds or less. The gel time can be obtained by using a gelatinization tester to drop an appropriate amount of the liquid resin composition for electronic part sealing onto a hot plat 165° C. in temperature, and then measuring the period (seconds) up to a time when the composition starts to gelatinize.

The hot weight reduction of the liquid resin composition of the invention for electronic part sealing is preferably 3% or less by weight, more preferably 2% or less by weight. The hot weight reduction can be obtained by using a thermogravimetric apparatus "TGA-Q500" (manufactured by TA Instrument) to heat 20 mg of the liquid resin composition for electronic part sealing from room temperature to 165° C. at a temperature-rising rate of 10° C./minute, further keeping the composition at 165° C. for 1 hours, and then measuring the weight reduction (% by weight).

(Electronic Part Apparatus)

The electronic part apparatus of the invention is provided with an electronic part sealed with the liquid resin composition of the invention for electronic part sealing. This electronic part apparatus may be an apparatus wherein active elements such as a semiconductor chip, a transistor, a diode and/or a thyristor, passive elements such as a condenser, a resistor, a resistor array, a coil and/or a switch, and/or some other electronic parts are mounted on a supporting member such as a lead frame, a wired tape carrier, a rigid wiring board, a flexible wiring board, a glass piece, or a silicon wafer, and further the electronic parts are sealed with the liquid resin composition of the invention for electronic part sealing. In particular, a semiconductor apparatus wherein one or more semiconductor elements are connected directly to a wiring board by means of a bump is preferred. A semiconductor apparatus undergoing flip-chip bonding, wherein one or more semiconductor elements are connected directly to a rigid wiring board, a flexible wiring board or a wiring board formed on a glass piece by means of a bump, is particularly preferred. Specific examples thereof include a flip-chip BGA (ball grid array), an LGA (land grid array), a COF (chip on film) and other semiconductor devices.

The liquid resin composition of the invention for electronic part sealing is suitable for an underfill material for flip-chip packaged semiconductor devices excellent in reliability. The field for which the liquid resin composition of the invention for electronic part sealing is particularly suitable is related to flip-chip packaged semiconductor devices wherein the material of bumps for connecting a wiring board and semiconductor elements is not any conventional lead-containing solder but a lead-free solder, such as Sn—Ag—Cu based solder. The liquid resin composition of the invention for electronic part sealing can certainly keep a good reliability also for flip-chip packaged semiconductor devices, wherein bump-connection is attained by use of lead-free solder, which is smaller in physical brittleness than conventional lead-containing solder. Furthermore, the liquid resin composition of the invention for electronic part sealing is suitable for a large-sized element that is an electronic part wherein the long side thereof is 5 mm or more. The composition exhibits good fluidity and filling performance for flip-chip connection in a narrow gap, wherein the distance between a wiring board which constitutes an electronic part apparatus and the bump-connection surface of the electronic part is 60 μm or less. In such a way, an electronic part apparatus can be provided which is also excellent in reliabilities such as moisture resistance and thermal impact resistance. The length of the long side of the electronic part is more preferably from 5 to 30 mm, and the distance between the wiring board and the bump-connection surface of the electronic part is more preferably from 30 to 60 μm.

In recent years, an interlayer dielectric having a lower dielectric constant is formed on a semiconductor element as the response speed of semiconductor elements becomes higher; however, the lower-dielectric-constant interlayer dielectric tends to have a smaller mechanical strength and be more easily broken down by external stress, so as to get wrong. Such a tendency becomes more remarkable as the semiconductor elements become larger. Thus, the stress-decreasing effect based on an underfill material has been desired. The liquid resin composition of the invention for electronic part sealing exhibits an excellent stress-decreasing effect for flip-chip connection of an electronic part which has a long side having a length of 5 mm or more and which is a semiconductor element having a dielectric layer having a dielectric constant of 3.0 or less. As a result, a highly reliable semiconductor apparatus can be provided. The length of the long side of the electronic part is more preferably from 5 to 30 mm, and the dielectric constant of the electronic part is more preferably 2.7 or less.

Examples of the manner of using the liquid resin composition of the invention for electronic part sealing to seal an electronic part include dispensing, casting and printing manners.

EXAMPLES

The invention will be more specifically described by way of the following examples; however, the invention is not limited to these examples.

Testing methods of characteristic tests made in working examples and comparative examples are together described below.

Various characteristics of each used liquid resin composition for electronic part sealing, the immersion period thereof, voids therein were observed and various reliabilities thereof were evaluated by methods described below under conditions described below.

As semiconductor devices used to observe the immersion period, the voids, and evaluate the reliabilities, the following two flip-chip BGAs (ball grid arrays) were used.

(a) Non Low-k Flip-Chip BGA

Chip size: 20×20×0.55 t mm (circuit: daisy chain connection of aluminum; passivation: polyimide film manufactured by HD Microsystems, Ltd., trade name: "HD 4000"), bump: solder balls (Sn—Ag—Cu; diameter: Φ80 μm; 7,744 pins), bump pitch: 190 μm, substrate: FR-5 (solder resist manufactured by Hitachi Chemical Co., Ltd.; trade name: "SR 7000"; 60×60×0.8 t mm), and distance between the substrate and the bump-connection surface: 50 μm.

(b) Low-k Flip-Chip BGA

Chip size: 20×20×0.55 t mm (having three formed dielectric layers each having a dielectric constant of 2.7; circuit: daisy chain connection of aluminum; passivation: polyimide film manufactured by HD Microsystems, Ltd., trade name: "HD 4000"), bump: solder balls (Sn—Ag—Cu; diameter: Φ80 μm; 7,744 pins), bump pitch: 190 μm, substrate: FR-5 (solder resist manufactured by Hitachi Chemical Co., Ltd., trade name: "SR 7000"; 60×60×0.8 t mm), and distance between the substrate and the bump-connection surface: 50 μm.

Semiconductor devices used in the following evaluating tests (8) to (11) were each produced by using each liquid resin composition for electronic part sealing as an underfill material to seal a semiconductor element in a dispensing manner, and then hardening the composition under the following heating conditions: the heating temperature was 165° C. and the heating period was 2 hours. The hardening of various test pieces used in evaluating tests (5) and (6) was also performed under the same conditions.

(1) Viscosity

The viscosity of each liquid resin composition for electronic part sealing was measured at 25° C. by use of an E-type viscometer (cone angle: 3°, and rotation number: 10 rpm).

(2) Gel Time

A gelatinization tester was used to drop down an appropriate amount of each prepared liquid resin composition for electronic part sealing onto a hot plate 165° C. in temperature, and the period (seconds) up to a time when the composition started to gelatinize was measured.

(3) Hot Weight Reduction

A thermogravimetric apparatus "TGA-Q500" (manufactured by TA Instrument) was used to heat 20 mg of each liquid resin composition for electronic part sealing in the air from room temperature to 165° C. at a temperature-rising rate of 10° C./minute. Furthermore, the composition was kept at 165° C. for 1 hour. The weight reduction (% by weight) at the time was measured.

(4) Tg

Each liquid resin composition for electronic part sealing was hardened at 165° C. for 1 hour to produce a test piece (3 mm×3 mm×20 mm). The Tg of the test piece was measured by use of a thermomechanical analyzer "TMA4000SA" (manufactured by Mac Science) under conditions that the load was 15 g, the measuring temperature was from 0 to 200° C. and the temperature-rising rate was 10° C./minute.

(5) Adhesive Force to a Solder Resist (SR Adhesive Force)

A test piece wherein each liquid resin composition for electronic part sealing was shaped into a diameter of 3 mm and a height of 1 mm was formed on a surface of a solder resist "SR 7000" (manufactured by Hitachi Chemical Co., Ltd.), and then a bond tester "DS 100 model" (manufactured by Dage Co.) was used to apply shearing force thereto under conditions that the head speed was 50 μm/second and the temperature was 25° C. The strength at which the test piece was peeled from the solder resist was measured.

This measurement was made just after the test piece was formed, and just after the test piece was treated under a HAST (highly accelerated temperature and humidity stress test) condition that the temperature was 130° C. and the relative humidity was 85% for 150 hours.

(6) Adhesive Force to Polyimide (PI Adhesive Force)

A test piece wherein each liquid resin composition for electronic part sealing was shaped into a diameter of 3 mm and a height of 1 mm was formed on a surface of a photosensitive polyimide "HD 40000" (manufactured by HD Microsystems, Ltd.), and then the bond tester "DS 100 model" (manufactured by Dage Co.) used to apply shearing force thereto under conditions that the head speed was 50 μm/second and the temperature was 25° C. The strength at which the test piece was peeled from the photosensitive polyimide was measured.

This measurement was made just after the test piece was formed and just after the test piece was treated under a HAST condition that the temperature was 130° C. and the relative humidity was 85% for 150 hours.

(7) Immersion Period

A semiconductor device was put onto a hot plate heated to 110° C., and a dispenser was used to drop down a predetermined amount of each liquid resin composition for electronic part sealing onto a side face (one side) of the semiconductor element. Measured was then the period (seconds) up to a time when the liquid resin composition for electronic part sealing penetrated up to the opposite side face of the semiconductor element.

(8) Presence or Absence of Voids

Each liquid resin composition for electronic part sealing was used as an underfill material to seal a semiconductor element. The inside of the thus-produced semiconductor device was observed with an ultrasonic defectoscope "AT-5500" (manufactured by Hitachi Construction Machinery Co., Ltd.), so as to examine whether or not voids were present.

(9) Reflow Resistance

Each liquid resin composition for electronic part sealing was used as an underfill material to seal a semiconductor element. The thus-produced semiconductor device was heated and dried at 120° C. for 12 hours, and then caused to absorb moisture at 85° C. and 60% RH for 168 hours. The resultant was passed in a reflow furnace in a far infrared ray heating mode (preheat: 150 to 180° C. for 50 seconds; peak temperature: 260° C.; heating period at 250° C. or higher: 40 seconds) 3 times. Thereafter, the inside of the semiconductor device was observed with the ultrasonic defectoscope "AT-5500" (manufactured by Hitachi Construction Machinery Co., Ltd.), so as to examine whether or not the resin hardened product and the semiconductor element were peeled from each other, whether or not the resin hardened product and the substrate were peeled from each other, and whether or not the resin hardened product was cracked. In such a way, an evaluation was made on the basis of the following: the number of defective packages to that of valuable packages.

(10) Temperature Cycle Resistance

Each liquid resin composition for electronic part sealing was used as an underfill material to seal a semiconductor element. The thus-produced semiconductor device was subjected to treatment of 1000 cycles, each of which was a heat cycle wherein treatment at −50° C. was conducted for 30 minutes and treatment at 150° C. was conducted for 30 minutes. A continuity test was made to examine whether or not the aluminum wiring and the pad snapped. In such a way, an evaluation was made on the basis of the following: the number of defective packages to that of valuable packages.

(11) Moisture Resistance

Each liquid resin composition for electronic part sealing was used as an underfill material to seal a semiconductor element. The thus-produced semiconductor device was treated under a HAST condition that the temperature was 130° C. and the relative humidity was 85% for 150 hours.

Thereafter, a continuity test was made to examine whether or not the aluminum wiring and the pad snapped. In such a way, an evaluation was made on the basis of the following: the number of defective packages to that of valuable packages.

Examples 1 to 8, and Comparative Examples 1 to 7

Components described below were blended with each other to give individual proportions (parts by weight) shown in Tables 1 to 2 described below. The resultants were each kneaded and dispersed by means of three rolls and a vacuum crusher, and then liquid resin compositions for electronic part sealing of Examples 1 to 8 and Comparative Examples 1 to 7 were produced.

The liquid resin compositions for electronic part sealing of Examples 1 to 8 and Comparative Examples 1 to 7 were evaluated in accordance with the various characteristic tests in the items (1) to (11). The evaluation results are shown in Tables 1 to 2. Any blank in the tables shows that the corresponding component was not blended.

As the individual components in the tables, the following were used.

(Epoxy Resins)
Epoxy resin 1: a liquid diepoxy resin obtained by epoxidizing bisphenol F and having an epoxy equivalent of 160 (trade name: "YDF-8170C", manufactured by Tohto Kasei Co., Ltd.)
Epoxy resin 2: a liquid trifunctional epoxy resin obtained by epoxidizing aminophenol and having an epoxy equivalent of 95 (trade name: "E630", manufactured by JER Co.)

(Hardening Agents)
Liquid amine 1: diethyltoluenediamine having an active hydrogen equivalent of 45 (trade name: "EPICURE W", manufactured by JER Co.)
Liquid amine 2: 3,3'-diethyl-4,4'-diamino-diphenyl-methane having an active hydrogen equivalent of 63 (trade name: "KAYAHARD A-A", manufactured by Nippon Kayaku Co., Ltd.)

(Hydrazide Compounds)
Hydrazide compound 1: adipic acid dihydrazide having an average particle diameter of 1.5 µm and an active hydrogen equivalent of 43.5 (trade name: "ADH-4S", manufactured by Ohtsuka Chemical Industrial Co., Ltd.)
Hydrazide compound 2: adipic acid dihydrazide having an average particle diameter of 15 µm and an active hydrogen equivalent of 43.5 (trade name: "ADH", manufactured by JAPAN HYDRAZINE COMPANY INC.)
Hydrazide compound 3: isophthalic acid dihydrazide having an average particle diameter of 1.8 µm and an active hydrogen equivalent of 48.5 (trade name: "IDH-S", manufactured by Ohtsuka Chemical Industrial Co., Ltd.)

(Inorganic Fillers)
Spherical fused silica having an average particle diameter of 1 µm (Hardening Promoting Agent)
2-phenyl-4-methyl-5-hydroxymethylimidazole (Silane Coupling Agent)
γ-glycidoxypropyltrimethoxysilane (Colorant)
Carbon black (trade name: "MA-100", manufactured by Mitsubishi Chemical Corp.)

(Ion Trapping Agent)
A bismuth based ion trapping agent (trade name: "IXE-500", manufactured by Toagosei Co., Ltd.)

In the tables, *1 to *3 are as follows:
*1: The active hydrogen equivalent of the liquid amine hardening agent represents the active hydrogen equivalent of the hardening agent when the total of the active hydrogen equivalent of the hardening agent and the active hydrogen equivalent of the hydrazide compounds were set to 1 equivalent per equivalent of the epoxy resin.
*2: The active hydrogen equivalent of the hydrazide compound(s) represents the active hydrogen equivalent of the hydrazide compound(s) when the total of the active hydrogen equivalent of the hardening agent and the active hydrogen equivalent of the hydrazide compound(s) was set to 1 equivalent per equivalent of the epoxy resin.
*3: The content (% by weight) of the inorganic filler represents the content of the inorganic filler in the whole of the liquid resin composition for electronic part sealing.

TABLE 1

| | | Examples | | | | | | | |
|---|---|---|---|---|---|---|---|---|---|
| | | 1 | 2 | 3 | 4 | 5 | 6 | 7 | 8 |
| Compositions of liquid resin composition for electronic part sealing | Epoxy resin 1 | 70 | 70 | 70 | 70 | 70 | 70 | 60 | 60 |
| | Epoxy resin 2 | 30 | 30 | 30 | 30 | 30 | 30 | 40 | 40 |
| | Liquid amine 1 | 32.2 | 30.5 | 30.5 | 27.0 | 30.5 | 30.5 | | |
| | Liquid amine 2 | | | | | | | 47.6 | 47.6 |
| | Hydrazide compound 1 | 1.6 | 3.3 | 3.3 | 6.6 | | 2.3 | 3.5 | 3.5 |
| | Hydrazide compound 2 | | | | | | | | |
| | Hydrazide compound 3 | | | | | 3.7 | 1.1 | | |
| | Hardening promoting agent | | | 1 | 1 | 1 | 1 | | 1 |
| | Inorganic filler | 211 | 211 | 212 | 212 | 212 | 212 | 230 | 230 |
| | Colorant | 1 | 1 | 1 | 1 | 1 | 1 | 1 | 1 |
| | Silane coupling agent | 3 | 3 | 3 | 3 | 3 | 3 | 3 | 3 |
| | Ion trapping agent | 3 | 3 | 3 | 3 | 3 | 3 | 3 | 3 |
| Active hydrogen equivalent of liquid amine hardening agent (*1) | | 0.95 | 0.9 | 0.9 | 0.8 | 0.9 | 0.9 | 0.9 | 0.9 |
| Active hydrogen equivalent of hydrazide compound(s) (*2) | | 0.05 | 0.1 | 0.1 | 0.2 | 0.1 | 0.1 | 0.1 | 0.1 |
| The content (% by weight) of inorganic filler (*3) | | 60 | 60 | 60 | 60 | 60 | 60 | 60 | 60 |
| Characteristics before hardening | Viscosity (Pa · s) | 15 | 16 | 16 | 20 | 17 | 18 | 23 | 25 |
| | Gel time (seconds) | 380 | 310 | 265 | 230 | 249 | 232 | 256 | 156 |
| | Hot weight reduction (% by weight) | 2.5 | 2.3 | 1.2 | 1.1 | 1.5 | 1.3 | 1.9 | 0.9 |
| Characteristics after hardening | Tg (° C.) | 130 | 135 | 130 | 133 | 130 | 133 | 130 | 130 |
| | SR adhesive force  Initial value (MPa) | 26 | 27 | 30 | 26 | 27 | 29 | 29 | 34 |
| | HAST 150-hours | 21 | 20 | 25 | 21 | 23 | 22 | 24 | 28 |

TABLE 1-continued

|  |  |  | Examples | | | | | | | |
|---|---|---|---|---|---|---|---|---|---|---|
|  |  |  | 1 | 2 | 3 | 4 | 5 | 6 | 7 | 8 |
|  | PI adhesive force | Initial value (MPa) | 27 | 29 | 30 | 29 | 30 | 28 | 29 | 30 |
|  |  | HAST 150-hours (MPa) | 22 | 20 | 22 | 23 | 22 | 21 | 23 | 23 |
| Evaluation results based on non low-K PKG | Shapabilities | Immersion period (seconds) | 75 | 75 | 77 | 84 | 80 | 80 | 82 | 85 |
|  |  | Voids | Not observed | Not observed | Not observed | Not observed | Not observed | Not observed | Not observed | Not observed |
|  | Reliabilities | Reflow resistance | 0/20 | 0/20 | 0/20 | 0/20 | 0/20 | 0/20 | 0/20 | 0/20 |
|  |  | Temperature cycle resistance | 0/20 | 0/20 | 1/20 | 0/20 | 1/20 | 0/20 | 0/20 | 0/20 |
|  |  | Moisture resistance | 0/20 | 0/20 | 0/20 | 0/20 | 0/20 | 0/20 | 1/20 | 0/20 |
| Evaluation results based on low-K PKG | Shapabilities | Immersion period (seconds) | 73 | 73 | 76 | 82 | 86 | 83 | 80 | 82 |
|  |  | Voids | Not observed | Not observed | Not observed | Not observed | Not observed | Not observed | Not observed | Not observed |
|  | Reliabilities | Reflow resistance | 0/20 | 0/20 | 0/20 | 0/20 | 0/20 | 0/20 | 0/20 | 0/20 |
|  |  | Temperature cycle resistance | 0/20 | 0/20 | 1/20 | 0/20 | 1/20 | 0/20 | 2/20 | 0/20 |
|  |  | Moisture resistance | 0/20 | 0/20 | 0/20 | 0/20 | 0/20 | 1/20 | 2/20 | 0/20 |

TABLE 2

|  |  |  | Comparative Examples | | | | | | |
|---|---|---|---|---|---|---|---|---|---|
|  |  |  | 1 | 2 | 3 | 4 | 5 | 6 | 7 |
| Compositions of liquid resin composition for electronic part sealing | Epoxy resin 1 |  | 70 | 60 | 70 | 60 | 70 | 70 | 60 |
|  | Epoxy resin 2 |  | 30 | 40 | 30 | 40 | 30 | 30 | 40 |
|  | Liquid amine 1 |  | 33.9 |  | 33.9 |  | 30.5 | 20.3 |  |
|  | Liquid amine 2 |  |  | 50.2 |  | 50.2 |  |  | 47.6 |
|  | Hydrazide compound 1 |  |  |  |  |  |  |  |  |
|  | Hydrazide compound 2 |  |  |  |  |  | 3.3 | 13.1 | 3.5 |
|  | Hydrazide compound 3 |  |  |  |  |  |  |  |  |
|  | Hardening promoting agent |  |  |  | 1 | 1 | 1 | 1 | 1 |
|  | Inorganic filler |  | 210 | 236 | 210 | 230 | 210 | 210 | 230 |
|  | Colorant |  | 1 | 1 | 1 | 1 | 1 | 1 | 1 |
|  | Silane coupling agent |  | 3 | 3 | 3 | 3 | 3 | 3 | 3 |
|  | Ion trapping agent |  | 3 | 3 | 3 | 3 | 3 | 3 | 3 |
| Active hydrogen equivalent of liquid amine hardening agent (*1) |  |  | 1 | 1 | 1 | 1 | 0.9 | 0.6 | 0.9 |
| Active hydrogen equivalent of hydrazide compound(s) (*2) |  |  | 0 | 0 | 0 | 0 | 0.1 | 0.4 | 0.1 |
| The content (% by weight) of inorganic filler (*3) |  |  | 60 | 60 | 60 | 60 | 60 | 60 | 60 |
| Characteristics before hardening | Viscosity (Pa · s) |  | 13 | 19 | 14 | 21 | 15 | 24 | 23 |
|  | Gel time (seconds) |  | 810 | 705 | 494 | 368 | 423 | 250 | 318 |
|  | Hot weight reduction (% by weight) |  | 4.2 | 3.3 | 2.6 | 2.5 | 2.7 | 1.5 | 2.4 |
| Characteristics after hardening | Tg (° C.) |  | 110 | 100 | 115 | 111 | 116 | 131 | 115 |
|  | SR adhesive force | Initial value (MPa) | 18 | 20 | 29 | 31 | 27 | 24 | 31 |
|  |  | HAST 150-hours (MPa) | 9 | 13 | 15 | 15 | 15 | 11 | 19 |
|  | PI adhesive force | Initial value (MPa) | 21 | 28 | 23 | 22 | 24 | 25 | 28 |
|  |  | HAST 150-hours (MPa) | 13 | 16 | 10 | 13 | 17 | 14 | 17 |
| Evaluation results based on non low-K PKG | Shapabilities | Immersion period (seconds) | 65 | 79 | 73 | 80 | 75 | 82 | 80 |
|  |  | Voids | Not observed | Not observed | Not observed | Not observed | Not observed | Not observed | Not observed |
|  | Reliabilities | Reflow resistance | 9/20 | 5/20 | 1/20 | 1/20 | 3/20 | 1/20 | 0/20 |
|  |  | Temperature cycle resistance | 4/20 | 10/20 | 0/20 | 2/20 | 2/20 | 1/20 | 2/20 |
|  |  | Moisture resistance | 4/20 | 5/20 | 6/20 | 3/20 | 5/20 | 6/20 | 3/20 |
| Evaluation results based on low-K PKG | Shapabilities | Immersion period (seconds) | 67 | 77 | 75 | 83 | 70 | 83 | 81 |
|  |  | Voids | Not observed | Not observed | Not observed | Not observed | Not observed | Not observed | Not observed |
|  | Reliabilities | Reflow resistance | 11/20 | 7/20 | 6/20 | 7/20 | 8/20 | 2/20 | 7/20 |
|  |  | Temperature cycle resistance | 5/20 | 13/20 | 2/20 | 4/20 | 5/20 | 1/20 | 8/20 |
|  |  | Moisture resistance | 3/20 | 4/20 | 5/20 | 6/20 | 6/20 | 9/20 | 5/20 |

In Comparative Examples 1 to 2, which neither contained a hydrazide compound, which is a component(C) in the invention, nor a hardening promoting agent, the gel time was long and the hot weight reduction was also large so that voids were generated. In Comparative Examples 3 to 4, which contained a hardening promoting agent but contained no hydrazide compound, which is a component (C), and Comparative Examples 5 and 7, in which a hardening promoting agent was contained and the particle diameter of the hydrazide compound powder was coarse, the gel time was shortened to some degree, and the hot weight reduction was also smaller, whereby the generation of voids was able to be prevented. However, when the compositions were each hardened for 1 hour, reaction therefor was insufficient so that the Tg was low. Additionally, the adhesive force to each adherend was small so that the various reliabilities, such as the reflow resistance, the temperature cycle resistance and the moisture resistance, were remarkably poor. In Comparative Example 6, wherein the proportion of a hydrazide compound, which is a component (C), in the Comparative Example 5 was made large, the gel time was shortened and the Tg also became high. However, the moisture resistance deteriorated since the adhesive force after the HAST treatment for 150 hours lowered largely.

On the other hand, in Examples 1 to 8, the gel time was short and the hot weight reduction was also small; thus, voids were not generated when the compositions were each shaped. Additionally, when the compositions were each hardened for 1 hour, reaction therefor advanced sufficiently so that a high Tg and a high adhesive force were exhibited. The productivity was also excellent. Furthermore, the adhesiveness after the HAST 150-hour treatment was improved, so that the various reliabilities, such as the reflow resistance, the temperature cycle resistance and the moisture resistance, were excellent.

The invention claimed is:

1. A liquid resin composition for electronic part sealing, comprising (A) an epoxy resin including a liquid epoxy resin, (B) a hardening agent including a liquid aromatic amine, (C) a hydrazide compound having an average particle diameter of less than 2 µm, and (D) an inorganic filler having an average particle diameter of less than 2 µm.

2. The liquid resin composition for electronic part sealing according to claim 1, wherein the hydrazide compound is at least one selected from aliphatic polybasic acid dihydrazide compounds having 2 to 10 carbon atoms, and aromatic polybasic acid dihydrazide compounds having 8 to 15 carbon atoms.

3. An electronic part apparatus provided with an electronic part sealed with a liquid resin composition for electronic part sealing according to claim 1.

4. The electronic part apparatus according to claim 3, wherein the electronic part is a semiconductor element, and the semiconductor element is connected directly onto a wiring substrate by means of a bump.

5. The electronic part apparatus according to claim 4, wherein the bump is made of a lead-free metal.

6. The electronic part apparatus according to claim 3, wherein the length of a long side of the electronic part is 5 mm or more, and further the distance between a wiring substrate which constitutes the electronic part apparatus and a bump-connection surface of the electronic part is 60 µm or less.

7. The electronic part apparatus according to claim 3, wherein the length of a long side of the electronic part is 5 mm or more, and further the electronic part is a semiconductor element having a dielectric layer having a dielectric constant of 3.0 or less.

8. An electronic part apparatus provided with an electronic part sealed with a liquid resin composition for electronic part sealing according to claim 2.

9. The electronic part apparatus according to claim 8, wherein the electronic part is a semiconductor element, and the semiconductor element is connected directly onto a wiring substrate by means of a bump.

10. The electronic part apparatus according to claim 9, wherein the bump is made of a lead-free metal.

11. The electronic part apparatus according to claim 8, wherein the length of a long side of the electronic part is 5 mm or more, and further the distance between a wiring substrate which constitutes the electronic part apparatus and a bump-connection surface of the electronic part is 60 µm or less.

12. The electronic part apparatus according to claim 8, wherein the length of a long side of the electronic part is 5 mm or more, and further the electronic part is a semiconductor element having a dielectric layer having a dielectric constant of 3.0 or less.

13. The electronic part apparatus according to claim 4, wherein the length of a long side of the electronic part is 5 mm or more, and further the distance between a wiring substrate which constitutes the electronic part apparatus and a bump-connection surface of the electronic part is 60 µm or less.

14. The electronic part apparatus according to claim 4, wherein the length of a long side of the electronic part is 5 mm or more, and further the electronic part is a semiconductor element having a dielectric layer having a dielectric constant of 3.0 or less.

15. The electronic part apparatus according to claim 9, wherein the length of a long side of the electronic part is 5 mm or more, and further the distance between a wiring substrate which constitutes the electronic part apparatus and a bump-connection surface of the electronic part is 60 µm or less.

16. The electronic part apparatus according to claim 9, wherein the length of a long side of the electronic part is 5 mm or more, and further the electronic part is a semiconductor element having a dielectric layer having a dielectric constant of 3.0 or less.

* * * * *